US012787453B2

(12) United States Patent
Yu et al.

(10) Patent No.: US 12,787,453 B2
(45) Date of Patent: Nov. 3, 2026

(54) PHOTOVOLTAIC MODULE, PREPARATION METHOD THEREOF AND PHOTOVOLTAIC POWER GENERATION APPARATUS

(71) Applicant: TONGWEI SOLAR (CHENGDU) CO., LTD., Chengdu (CN)

(72) Inventors: Mingmao Yu, Chengdu (CN); Zheng Sun, Chengdu (CN); Song Peng, Chengdu (CN); Haiping Shen, Chengdu (CN); Zhengyue Xia, Chengdu (CN); Guoqiang Xing, Chengdu (CN)

(73) Assignee: TONGWEI SOLAR (CHENGDU) CO., LTD., Chengdu (CN)

( * ) Notice: Subject to any disclaimer, the term of this patent is extended or adjusted under 35 U.S.C. 154(b) by 0 days.

(21) Appl. No.: 19/284,854

(22) Filed: Jul. 30, 2025

(65) Prior Publication Data

US 2026/0164813 A1 Jun. 11, 2026

(30) Foreign Application Priority Data

Dec. 6, 2024 (CN) ........................ 202411784867.0

(51) Int. Cl.
*H10F 19/80* (2025.01)

(52) U.S. Cl.
CPC .................................. *H10F 19/80* (2025.01)

(58) Field of Classification Search
CPC ...... H10F 19/80; H10F 19/804; H10F 19/902; H10F 19/906
See application file for complete search history.

(56) References Cited

U.S. PATENT DOCUMENTS

2012/0055551 A1 3/2012 Rodriquez-Parada et al.
2020/0013912 A1* 1/2020 Matsuo ................ H01G 9/2077
(Continued)

FOREIGN PATENT DOCUMENTS

CN 111363483 A 7/2020
CN 113061397 A 7/2021
(Continued)

OTHER PUBLICATIONS

Jiong et al., "Using new kinds of novel ribbons to increase the power of PV module", English abstract only, China Academic Journal Electronic Publishing House, Renewable Energy Resources, vol. 34, No. 11, Nov. 2016, 4 pages.
(Continued)

*Primary Examiner* — Jayne L Mershon
(74) *Attorney, Agent, or Firm* — Dority & Manning, PA

(57) ABSTRACT

A photovoltaic module, a prepared method thereof and a photovoltaic power generation apparatus are provided. A refractive index of a plurality of bonding units to light, a refractive index of an encapsulation layer to light, a thickness of the encapsulation layer and a height of each of the plurality of bonding units are adjusted, and an intensity R of refractive light is in a range of 0.014 to 0.118, such that incident light reflects very little at an interface between the plurality of bonding units and an adhesive film. Ratio Y of the height of each of the plurality of bonding units to the thickness of the encapsulation layer is less than 0.9, no bubble is formed between the plurality of bonding units and the encapsulation layer or in the plurality of bonding units or in the encapsulation layer.

19 Claims, 4 Drawing Sheets

(56) References Cited

U.S. PATENT DOCUMENTS

| | | | | |
|---|---|---|---|---|
| 2025/0142981 | A1* | 5/2025 | Yu | B32B 25/08 |
| 2025/0366219 | A1* | 11/2025 | Lee | H10F 19/807 |

FOREIGN PATENT DOCUMENTS

| | | | |
|---|---|---|---|
| CN | 116072753 | A | 5/2023 |
| CN | 219937055 | U | 10/2023 |
| JP | 2013207260 | A | 10/2013 |
| JP | 2015233096 | A | 12/2015 |
| KR | 101542002 | B1 | 8/2015 |
| WO | WO 2008112180 | A2 | 9/2008 |
| WO | WO 2021227169 | A1 | 11/2021 |
| WO | WO 2024244371 | A1 | 12/2024 |

OTHER PUBLICATIONS

Lin et al., "Synthesis of ultraviolet curable encapsulating adhesives and their package applications for organic optoelectronic devices", Solid State Sciences, vol. 13, 2011, 7 pages.

Grant Decision received in corresponding Application No. CN 202411784867.0, dated Jan. 29, 2025, 3 pages.

Chinese Office Action received in corresponding Application No. CN 202411784867.0, dated Jan. 17, 2025, 7 pages.

Office Action received in corresponding Application No. KR 1020250104689, dated May 22, 2026, 10 pages.

* cited by examiner

PHOTOVOLTAIC MODULE, PREPARATION METHOD THEREOF AND PHOTOVOLTAIC POWER GENERATION APPARATUS

CROSS-REFERENCE TO RELATED APPLICATION

This application claims priority to Chinese patent application No. 202411784867.0, filed on Dec. 6, 2024, and titled "PHOTOVOLTAIC MODULE, METHOD THEREOF AND PHOTOVOLTAIC POWER GENERATION APPARATUS". The content of the above identified application is hereby incorporated herein in its entirety by reference.

TECHNICAL FIELD

The present disclosure relates to the field of photovoltaic technology, and in particular, to a photovoltaic module, a method thereof and a photovoltaic power generation apparatus.

BACKGROUND

A metal electrode on a front surface of a solar cell and a back surface of a solar cell are used to lead out an internal current and may be divided into busbars and a fingers (i.e., fine grids). The busbars mainly play a role of collecting a current of the fingers and connecting the fingers in series, while the fingers are used to collect photogenerated charge carriers. A gate line pattern has evolved from the past 4BB (busbars) and 5BB (busbars) to MBB (i.e., multiple busbars including 9-15 grids), and then to popular SMBB technology in recent years (i.e., super multi busbars including 16 grids and more). Adhesive interconnect photovoltaic module technology is a further upgrade of the SMBB technology and has gradually become one of mainstream trends in current research and development.

Adhesive, as one of key materials used in adhesive interconnect photovoltaic module technology, has attracted great attention. A common adhesive is mainly divided into silicone adhesive system, acrylic adhesive system, and epoxy resin adhesive system. The properties of the adhesive, such as bonding strength, yellowing performance, hardness and so on, have a significant impact on the performance of a photovoltaic module and are factors that require to be considered in related technology research and development. In the actual research and development and trial production process, the printing quality, the number of adhesive dots, and the size of adhesive dots and so on also affect reliability of a photovoltaic module. For example, adhesive-dot deformation, reduction in the number of the adhesive dots, and the size of the adhesive dots can easily lead to insufficient adhesive strength of the adhesive, thereby affecting a yield of the photovoltaic module.

In view of this, the present invention is proposed.

SUMMARY

In the present disclosure, a photovoltaic module, a method thereof and a photovoltaic power generation apparatus are provided, it is intended to improve power of the photovoltaic module while ensuring a yield of the photovoltaic module, while also enhancing an aesthetic appearance of the photovoltaic module.

The present disclosure is achieved as following.

In a first aspect, a photovoltaic module in the present disclosure is provided. The photovoltaic module includes a battery string and an encapsulation layer. The battery string includes a plurality of solar cells and a plurality of conductive connectors. Two adjacent of the plurality of solar cells are electrically connected to each other via the plurality of conductive connectors. The encapsulation layer is attached to the battery string. The plurality of bonding units are provided between the encapsulation layer and the battery string. The plurality of bonding units are configured to bond the plurality of conductive connectors on the plurality of solar cells. A characteristic value R satisfies following formula (1):

$$R = \frac{|n2 - n1|}{\frac{1}{2}(n1 + n2)}.$$

A characteristic value Y satisfies following formula (2):

$$Y = \frac{h}{H}.$$

The characteristic value R is in a range of 0.014 to 0.118. n1 represents a refractive index of the plurality of bonding units to light. n2 represents a refractive index of the encapsulation layer to light. The characteristic value Y is less than or equal to 0.9. H represents a thickness of the encapsulation layer. h represents a height of each of the plurality of bonding units.

In some embodiments, the characteristic value R is in a range of 0.02 to 0.097.

In some embodiments, the refractive index n1 of the plurality of bonding units to the light is less than the refractive index n2 of the encapsulation layer to the light.

In some embodiments, the plurality of bonding units are disposed on at least one surface of the battery string. Alternatively, the plurality of bonding units are formed by curing an adhesive.

In some embodiments, the refractive index n1 of the plurality of bonding units to the light is in a range of 1.35 to 1.60. The height of each of the plurality of bonding units is in a range of 50 μm to 280 μm. Alternatively, the adhesive configured to form the plurality of bonding units is selected from the group consisting of an organic silicone adhesive, an acrylic adhesive, an epoxy resin adhesive and any combination thereof.

In some embodiments, the refractive index n2 of the encapsulation layer to the light is in a range of 1.40 to 1.65. The thickness of the encapsulation layer is in a range of 300 μm to 400 μm. Alternatively, the encapsulation layer is formed by laminating and cross-linking an encapsulation adhesive film. The encapsulation adhesive film is selected from the group consisting of an encapsulation adhesive film of polyolefin elastomer, an encapsulation adhesive film of ethylene vinyl acetate copolymer, an encapsulation adhesive film of a co-extrusion product with polyolefin elastomer and ethylene vinyl acetate copolymer, and any combination thereof.

In some embodiments, gray values of different areas of the photovoltaic are obtained by a camera to capture a surface of the photovoltaic module, so as to calculate a characteristic value G. The characteristic value G satisfies following formula:

$$G = |g2 - g1|,$$

wherein the characteristic value G represents a threshold of the gray value, g1 represents a gray value of one part of the surface of the photovoltaic module without the plurality of bonding units, and g2 represents a gray value of another part of the surface of the photovoltaic module with the plurality of bonding units. The characteristic value G is less than or equal to 20.

In some embodiments, a surface of each of the plurality of conductive connectors on a position where the plurality of bonding units are located is wrapped by each of the plurality of bonding units.

In some embodiments, on a position where the plurality of bonding units are located, each of the plurality of bonding units is disposed between each of the plurality of conductive connectors and each of the plurality of solar cells correspondingly, and a part of a surface of each of the plurality of conductive connectors is covered by each of the plurality of bonding units.

In some embodiments, a front surface of each of the plurality of solar cells and a back surface of each of the plurality of solar cells are both provided with the plurality of conductive connectors and the plurality of bonding units. The encapsulation layer includes a front adhesive film and a back adhesive film. The front adhesive film is attached to a front surface of the battery string. The back adhesive film is attached to a back surface of the battery string;

the photovoltaic module meets at least one of following conditions:

the characteristic value R is in a range of 0.014 to 0.118;

a ratio Y of a height of each of the plurality of bonding units to a thickness of the front adhesive film is less than or equal to 0.9;

and/or, the plurality of conductive connectors are ribbons.

In some embodiments, the plurality of solar cells are disposed at interval. One surface of one of the plurality of solar cells is connected to another opposite surface of adjacent one of the plurality of solar cells.

In some embodiments, the photovoltaic module further includes a front protecting substrate and a back protecting substrate. The front protecting substrate is attached to an end surface of the front adhesive film away from the battery string. The back protecting substrate is attached to an end surface of the back adhesive film away from the battery string.

In some embodiments, the front protecting substrate is made of glasses. Alternatively, the back protecting substrate is made of at least one of the glass and high molecular polymer. The high molecular polymer includes polyethylene terephthalate, polyolefin copolymer, polyamide, polyvinyl fluoride, and polyvinylidene difluoride.

In a second aspect, a preparing method for the photovoltaic module in the above embodiments of the present disclosure is provided. The method includes disposing a plurality of conductive connectors on at least a surface of a plurality of solar cells along a thickness direction of each of the plurality of solar cells, bonding the plurality of conductive connectors with the plurality of solar cells via a plurality of bonding units to form a battery string; and encapsulating the battery string via an encapsulation layer of the photovoltaic module. A characteristic value R satisfies following formula (1):

$$R = \frac{|n2 - n1|}{\frac{1}{2}(n1 + n2)}.$$

A characteristic value Y satisfies following formula (2):

$$Y = \frac{h}{H}.$$

n1 represents a refractive index of the plurality of bonding units to light. n2 represents a refractive index of the encapsulation layer to light. The characteristic value R is in a range of 0.014 to 0.118 by adjusting the refractive index n1 of the plurality of bonding units to the light and the refractive index n2 of the encapsulation layer to the light. H represents a thickness of the encapsulation layer. h represents a height of each of the plurality of bonding units. The characteristic value Y is less than or equal to 0.9 by adjusting the thickness H of the encapsulation layer and the height h of each of the plurality of bonding units.

In some embodiments, disposing the plurality of conductive connectors on the at least one surface of the plurality of solar cells along the thickness direction of each of the plurality of solar cells, bonding the plurality of conductive connectors with the plurality of solar cells via a plurality of bonding units to form a battery string further includes: disposing the plurality of solar cells along a first direction, disposing a fine grid line of each of the plurality of solar cells along a second direction, and disposing the plurality of conductive connectors along the first direction when the plurality of conducive connectors are mounted. The first direction intersects with the second direction. The battery string is prepared by applying an adhesive to fix and then welding. Alternatively, the battery string is prepared by welding and then applying an adhesive to fix.

In some embodiments, the characteristic value R is in a range of 0.02 to 0.097.

In some embodiments, the refractive index n1 of the plurality of bonding units to the light is less than the refractive index n2 of the encapsulation layer to the light.

In a third aspect, a photovoltaic power generation apparatus is provided. The photovoltaic power generation apparatus includes the photovoltaic module of any one of the above embodiments or a photovoltaic module obtained by the method of any one of the above embodiments.

The number of the photovoltaic module is M, M photovoltaic modules are connected in series, and Mis an integer not less than 1.

The present disclosure includes following advantages. In the present disclosure, the refractive index of the plurality of bonding units to the light, the refractive index of the encapsulation layer to the light, the thickness of the encapsulation layer and the height of each of the plurality of bonding units are adjusted. When the light enters the plurality of bonding units from the encapsulation layer, an intensity R of the refractive light is in the range of 0.014 to 0.118, such that incident light reflects very little at an interface between the plurality of bonding units and an adhesive film. The ratio Y of the height of each of the plurality of bonding units to the thickness of the encapsulation layer is less than 0.9, no bubble is formed between the plurality of bonding units and the encapsulation layer or in the plurality of bonding units or in the encapsulation layer, resulting in improving utilization rate of the incident light, facilitating improving power of the photovoltaic module. A contour of each of the plurality of bonding units can not be seen on the photovoltaic module being laminated under visual inspection, and the contour of the plurality of bonding units are hidden in the encapsulation layer, resulting in improving the aesthetics of the appearance of the photovoltaic module. In the present disclosure, since the number of the plurality of bonding units and the size of each the plurality of bonding units can be maintained at an original level without reducing the adhesive strength of the adhesive, ensuring the yield of the photovoltaic module.

In the related technology, more attention has been paid to bonding stability of a plurality of bonding units, without addressing an issue of how the presence of the plurality of bonding units (such as glue points) can affect the aesthetics of the photovoltaic module, and without focusing on how to make the contour of the bonding unit invisible under the visual inspection. The inventor creatively regulates the refractive index of the plurality of units to the light and the refractive index of the encapsulation layer to the light, so that the refractive index of the plurality of units to the light and the refractive index of the encapsulation layer to the light satisfy a specific relationship, resulting in achieving the technical effect of not being able to see the contour of the plurality of bonding units under the visual inspection.

In addition, the inventor discovers that even the characteristic value is in the range of 0.014 to 0.118, the adhesive dot may be seen under the visual inspection. The inventor speculated that the above situation is caused by the bubble on the plurality of bonding units or at the interface between the plurality of bonding units and the adhesive film, based on the enlarged detection experiment results. When the bubble appears on the surface of the plurality of bonding units or within the plurality of bonding units, the intensity of the reflection light at the interface between the plurality of bonding unit and the bubble will significantly increase, resulting in that adhesive dots is visible under the visual inspection, which in turn affects the aesthetics of the photovoltaic module. Furthermore, the inventor found that the height of each of the plurality of bonding units and the thickness of the encapsulation layer have a significant impact on the bubble formed in the photovoltaic module. The inventor adjusted the thickness of the encapsulation layer and the height of the plurality of bonding units to a specific ratio, ensuring that the contour of the plurality of bonding units is not visible under the visual inspection. On the basis of the above, the inventor unexpectedly finds that the photovoltaic module prepared by the present invention can further improve the power of the photovoltaic module while the contour of the plurality of bonding units can not be seen under the visual inspection.

In some embodiments, the present invention makes the refractive index n1 of the plurality of bonding units to the light is less than the refractive index n2 of the encapsulation layer to the light. The light entering the bonding unit from the front adhesive film or the back adhesive film is defined as a light entering the light sparse medium from the light dense medium, and the refraction light will move away from the normal, resulting in allowing more incident light to reach the surface of the plurality of solar cell, thereby improving the power of the photovoltaic module.

BRIEF DESCRIPTION OF THE DRAWINGS

In order to provide a clearer explanation of a technical solution of embodiments of the present disclosure, a brief introduction will be given to accompanying drawings required for the embodiments. It should be understood that the following drawings only illustrate certain embodiments of the present disclosure and should not be considered as limiting the scope of the present disclosure. For those skilled in the art, other relevant drawings can be obtained based on these drawings without creative labor.

REFERENCE SIGNS ARE AS FOLLOWS

100 represents a photovoltaic module; 110 represents a battery string; 111 represents a solar cell; 112 represents a conductive connector; 113 represents a bonding unit; 120 represents an encapsulation layer; 121 represents a front adhesive film; 122 represents a back adhesive film; 131 represents a front protecting substrate; 132 represents a back protecting substrate; 140 represents a busbar; 150 represents a frame; 160 represents a bubble; 161 represents a bubble inside an adhesive dot; and 162 represents a bubble outside an adhesive dot.

DETAILED DESCRIPTION

In order to make above objectives, features, and advantages of the present disclosure more obvious and understandable, a detailed explanation of the specific implementation of the present disclosure will be provided below. If specific conditions are not specified in examples, the examples follow conventional conditions or conditions recommended by a manufacturer. Reagents or instruments without specifying the manufacturer are conventional products that can be obtained via commercial purchase.

In related technology, there is currently neither research on utilizing characteristics of the adhesive to improve power of the photovoltaic module in the related adhesive interconnect photovoltaic module technology, nor a design requirement for an aesthetic appearance of the adhesive interconnect photovoltaic module.

Figure 1:
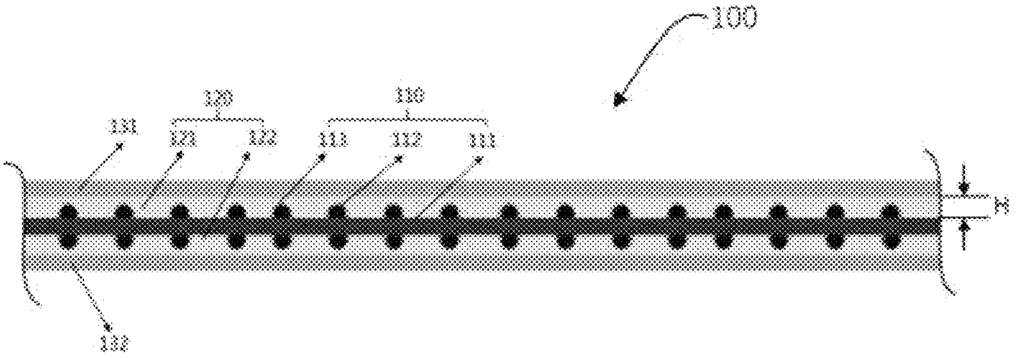
FIG. 1 is a cross-sectional schematic diagram of an adhesive dot fully wrapping a ribbon.
Figure 2:
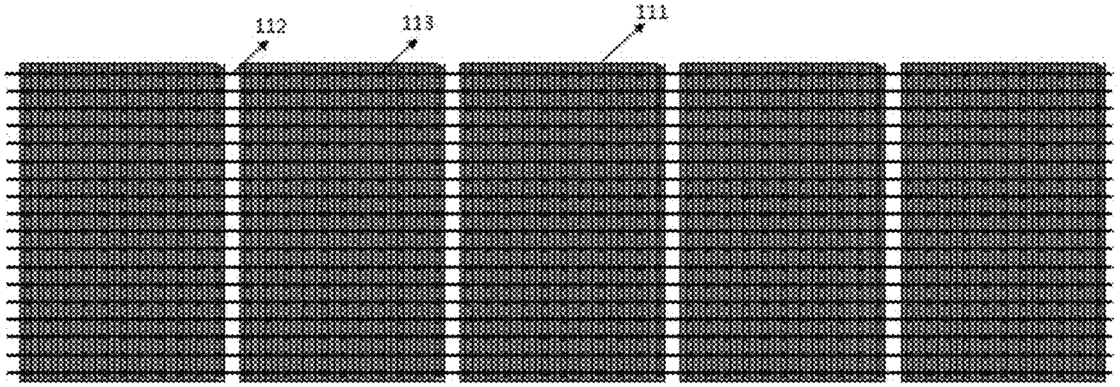
FIG. 2 is a partial schematic diagram of a battery string.

Related technology focuses more on stability of the plurality of bonding units, but does not pay attention to a problem that presence of bonding units (such as an adhesive dot) will affect the aesthetics of the photovoltaic module, and does not focus on how to make a contour of the plurality of bonding unit invisible under visual inspection. The inventor creatively adjusts a refractive index of the plurality of bond units to light and a refractive index of an encapsulation layer to light to satisfy a specific relationship, while controlling a thickness of the encapsulation layer and a height of each of the plurality of bonding units to a specific ratio, so that the contour of the plurality of bonding units can not be seen under the visual inspection, and at the same time, the inventor unexpectedly discovers that it can further improve power of the photovoltaic module. Referring to FIGS. 1 and 2, a photovoltaic module 100 in some embodiments of the present disclosure is provided. The photovoltaic module 100 includes a battery string 110 and an encapsulation layer 120. The encapsulation layer 120 is attached to the battery string 110 to play a role of encapsulating and protecting the battery string 110.

The battery string 110 includes a plurality of solar cells 111 and a plurality of conductive connectors 112. The plurality of solar cells 111 are disposed in sequence, and adjacent two of the plurality of solar cells 111 are electrically connected via the plurality of conductive connectors 112 to form the battery string 110. A plurality of bonding units 113 are provided between the encapsulation layer 120 and the battery string 110. The plurality of conductive connectors 112 is attached to the plurality of solar cells 111 via the plurality of bonding units 113 (such as a plurality of adhesive dots), so as to improve connecting stability of each of the plurality of conductive connectors 112.

A refractive index of the plurality of bonding units 113 to light and a refractive index of the encapsulation layer 120 to light are adjusted in the present disclosure, such that the refractive index of the plurality of bonding units 113 to the light and the refractive index of the encapsulation layer 120 to the light satisfy a specific formula, resulting in that a contour of the plurality of bonding units can not be seen under visual inspection. Furthermore, the photovoltaic module prepared in the present disclosure can further improve the power of the photovoltaic module.

Figure 3:
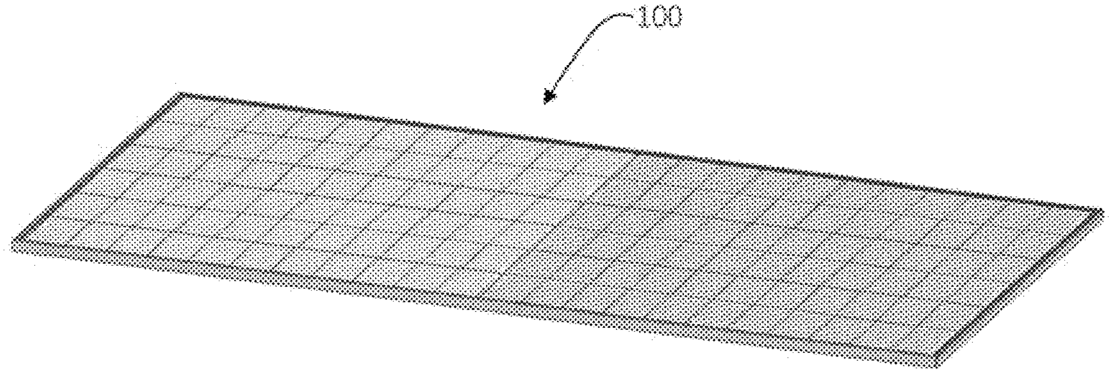
FIG. 3 is a schematic diagram of a photovoltaic module in an embodiment.
Figure 4:
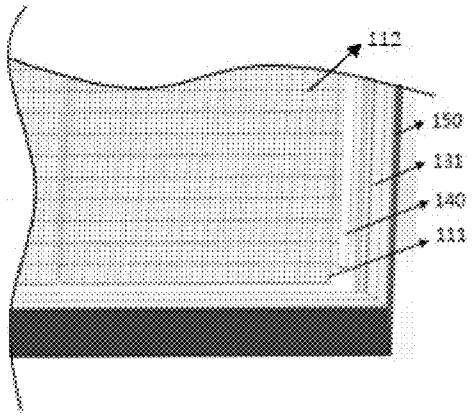
FIG. 4 is a partial schematic diagram of a photovoltaic module in an embodiment.

Referring to FIGS. 3 and 4, since compatibility between different refractive indices of different encapsulation materials have a relative great influence for the power and the appearance of the photovoltaic module. In the embodiment of the present disclosure, a material of the encapsulation layer and a material of each of the plurality of bonding units 113 are selected, such that the refractive index of the encapsulation layer to the light and the refractive index of the plurality of bonding units 113 to the light satisfy a specific requirement, and then after the photovoltaic module being laminated, the plurality of bonding units 113 is hidden in the encapsulation layer 120, and the contour of the plurality of bonding units 113 can not be seen from a surface of the encapsulation layer 120. In the embodiments of the present disclosure, a characteristic value R is defined as an intensity of the light when the light enters the plurality of bonding units 113 from the encapsulation layer 120. A formula of the characteristic value R is as following:

$$R = \frac{|n2 - n1|}{\frac{1}{2}(n1 + n2)};$$

wherein a characteristic value Y is defined as a matching relationship between a height of the plurality of bonding units 113 and a thickness of the encapsulation layer 120. A formula of the characteristic value Y is defined as following:

$$Y = \frac{h}{H},$$

wherein in the formula, n1 represents a refractive index of the plurality of bonding units 113 to light and n2 represents a refractive index of the encapsulation layer 120 to light. By adjusting a value of the refractive index n1 and a value of the refractive index n2, a characteristic value R is in a range of 0.014 to 0.118, such as 0.014, 0.015, 0.016, 0.017, 0.018, 0.019, 0.020, 0.030, 0.040, 0.050, 0.060, 0.070, 0.080, 0.090, 0.100, 0.110, 0.118 and so on.

H represents a thickness of the encapsulation layer 120. The thickness H of the encapsulation layer 120 is defined as a distance between a first position of the encapsulation layer, in which the first position of the encapsulation is located on a surface of each of the plurality of solar cells and mostly towards the surface of each of the plurality of solar cells along a direction perpendicular to the battery string, and a second position of the encapsulation layer, in which the second position of the encapsulation is located on the surface of each of the plurality of solar cells and mostly away from the surface of each of the plurality of solar cells along a direction perpendicular to the battery string, which is shown in FIG. 1. When the encapsulation layer is disposed on two surfaces of each of the plurality of solar cells, H represents a thickness of the encapsulation layer disposed on one of the two surfaces of each of the plurality of solar cells. A position for testing the thickness H may be selected at 5 mm near each of the plurality of bonding units 113.

Figure 5:
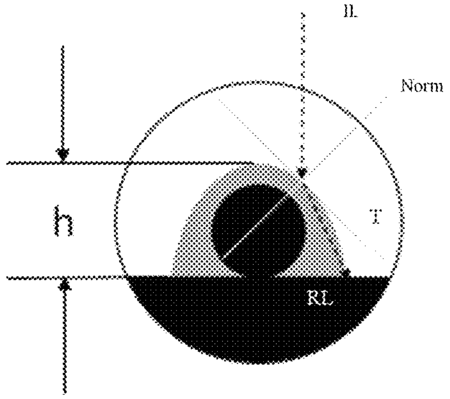
FIG. 5 is a schematic diagram of a propagation of incident light, in which a refractive index n1 of a plurality of bonding units to light is less than a refractive index n2 of an encapsulation layer to light, wherein "RL" represents a refracted light, "T" represents a tangent, "Norm" represents the normal, and "IL" represents an incident light.

Referring to FIG. 5, h represents a height of each of the plurality of bonding units 113. The height h of each of the plurality of bonding units 113 is defined as a distance between a first position of each of the plurality of bonding units 113 and a second position of each of the plurality of bonding units 113 along the direction perpendicular to the plurality of solar cells 111. The first position of each of the plurality of bonding units 113 is located on a surface of each of the plurality of solar cells 111 and mostly towards the surface of each of the plurality of solar cells 111. The second position of each of the plurality of bonding units 113 is located on the surface of each of the plurality of solar cells 111 and mostly away from the surface of each of the plurality of solar cells 111. When the plurality of bonding units 113 are disposed on the two surfaces of each of the plurality of solar cells 111, h represents a distance of each of the plurality of bonding units 133 extending along a direction perpendicular to the battery string.

The characteristic value Y is less than or equal to 0.9 by adjusting the thickness H and the height h. The characteristic value Y may be 0.1, 0.2, 0.3, 0.4, 0.5, 0.6, 0.7, 0.8, 0.9 and so on.

By adjusting the characteristic value R in the range of 0.014 to 0.118, the compatibility between the refractive index of the plurality of bonding units 113 to the light, in which the plurality of bonding units 113 is located on the surface of each of the plurality of solar cells, and the refractive index of the encapsulation layer 120 to the light, in which the encapsulation layer 120 is located on the surface of each of the plurality of solar cells, is optimized, so as to reduce a refractive intensity of an incident light (i.e., "IL") between the plurality of bonding units 113 and the encapsulation layer 120, while controlling a propagation direction of the incident light in an intersection area among the encapsulation layer 120, the plurality of bonding units 113, and the plurality of conductive connectors 112, such that more incident light can reach a surface of each of the plurality of solar cells 111, resulting in improving the power of the photovoltaic module. In addition, the characteristic value Y is less than or equal to 0.9 by optimizing the compatibility between the height of each of the plurality of bonding units 113 and the thickness of the encapsulation layer 120 on the surface of each of the plurality of solar cells 111, such that a bubble may be avoided from generating between the plurality of bonding units 113 and the encapsulation layer 120 or in the plurality of bonding units 113 or in the encapsulation layer 120, resulting in further improving utilization rate of the incident light. Since a reflective light (i.e., "RL") is greatly reduced, there are no clear boundary between the plurality of adhesive dots and an adhesive film, which visually integrates and improves the aesthetic performance of the photovoltaic module.

When the characteristic value R is less than 0.014, n1 is close to n2. When the incident light enters the plurality of bonding units 113 (such as the plurality of bonding units) from the encapsulation layer 120, the incident light propagates almost in a straight line and is easily blocked by ribbons, which is not conducive to improving the power of the photovoltaic module. When the characteristic value R is greater than 0.118, the contour of the plurality of adhesive dots may be seen on the surface of the photovoltaic module, so an appearance of the photovoltaic module and the power of the photovoltaic module are not best.

Figure 7:
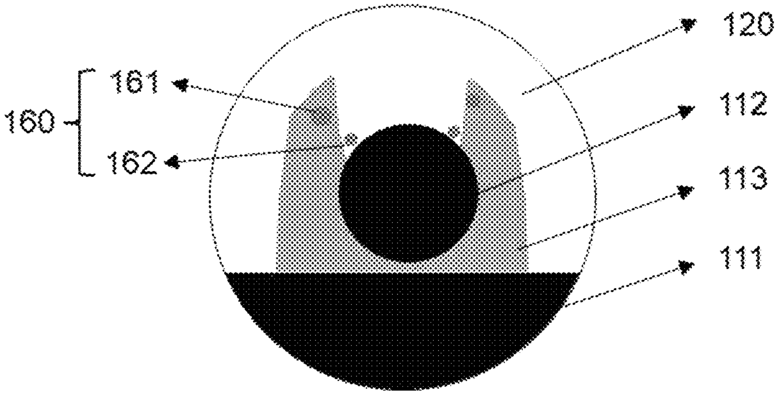
FIG. 7 is a diagram of a generation of a bubble.

When the characteristic value Y is greater than 0.9, i.e, the thickness H is too less or the height h is too greater, and when the thickness H of the encapsulation layer 120 is too less, the bubble is prone to generate in the adhesive film due to insufficient filling of the adhesive film, and the insufficient filling of the adhesive film is due to insufficient amount of the adhesive film, so as to affect a performance of the photovoltaic module and the appearance of the photovoltaic module. When the bubble is appeared on a surface of each of the plurality of adhesive dot, since a refractive index of the bubble is close to 1, an intensity R of a reflection light of an interface between the bubble and the plurality of adhesive dots is much greater than 0.118, a part of the adhesive dot may be seen on the surface of the photovoltaic module. When each of the plurality of bonding units 113 (such as the plurality of adhesive dots) are greater, referring to FIG. 7, due to a special nature of a printing process, the plurality of adhesive dots are prone to carry the bubble, and the bubble enters inside the plurality of adhesive dots, resulting in a formation of a bubble 160 (including a bubble 161 inside an adhesive dot and a bubble 162 outside an adhesive dot). Furthermore, since each of the plurality of bonding units 113 is too greater, a narrow gap between the ribbon and the plurality of adhesive dots is not easy to fill, and the bubble may also appear, such that the plurality of adhesive dots can be seen, which is not conducive to the performance of the photovoltaic module.

In some embodiments, the characteristic value R is in a range of 0.02 to 0.097 by adjusting the value of the refractive index n1 and the value of the refractive index n2. By controlling the characteristic value R in the range of 0.02 to 0.097, battery efficiency may be further improved based on that the plurality of adhesive dots can not be seen on the surface of the photovoltaic module.

In some embodiments, in order to better optimize compatibility between the adhesive film and the adhesive and improve utilization rate of an incident light source, the refractive index n1 of the plurality of bonding units 113 to the light is less than the refractive index n2 of the encapsulation layer 120 to the light. When the refractive index n1 is less than the refractive index n2, the encapsulation layer 120 is regarded as an optical dense medium, each of the plurality of bonding units 113 is regarded as an optical thinner medium, when the light enters the optical thinner medium from the optical dense medium, the refractive light will move away from the normal (i.e., Norm), which is shown in FIG. 5. In this condition, more incident light can reach the surface of the plurality of solar cells, facilitating improving power of the photovoltaic module.

Figure 6:
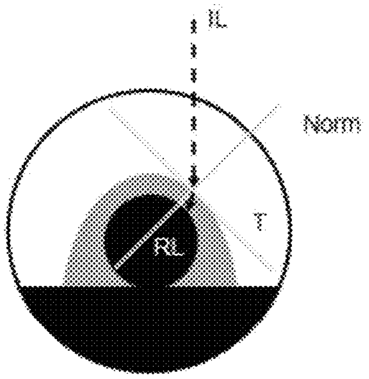
FIG. 6 is a schematic diagram of a propagation of incident light, in which a refractive index n1 of a plurality of bonding units to light is greater than a refractive index n2 of an encapsulation layer to light.

On the contrary, when the refractive index n1 is greater than the refractive index n2, a schematic diagram of a light propagation is shown in FIG. 6, the incident light will close to the normal (i.e., "Norm"), which is prone to blocking the ribbons and is not conducive to improving the power of the photovoltaic module.

In some embodiments, the refractive index n1 of the plurality of bonding units 113 to the light is in a range of 1.35 to 1.6, such as 1.35, 1.40, 1.45, 1.50, 1.55, 1.60 and so on. The refractive index of an adhesive configured to form the plurality of bonding units 113 to light is substantially the same as the refractive index n1 of the plurality of bonding units 113. The refractive index of the adhesive configured to form the plurality of bonding units 113 is also in the range of 1.35 to 1.60. The adhesive configured to form the plurality of bonding units 113 is selected from the group consisting of an organic silicone adhesive, an acrylic adhesive, an epoxy resin adhesive, and any combination thereof.

Furthermore, the refractive index n2 of the encapsulation layer 120 to the light is in a range of 1.40 to 1.65, such as 1.40, 1.45, 1.50, 1.55, 1.60, 1.65 and so on. The encapsulation layer 120 is formed by laminating and cross-linking an encapsulation adhesive film, and the encapsulation adhesive film is selected from the group consisting of an encapsulation adhesive film of polyolefin elastomer, an encapsulation adhesive film of ethylene vinyl acetate copolymer, an encapsulation adhesive film of a co-extrusion product with polyolefin elastomer and ethylene vinyl acetate copolymer, and any combination thereof.

When the refractive index n1 of the plurality of bonding units 113 is too less or too greater (less than 1.35 or greater than 1.65), the plurality of bonding units 113 are required to add a greater amount of substances with a low refractive index or a high refractive index for modification, resulting in greatly affecting other performances of the adhesive.

In some embodiments, a height of each of the plurality of bonding units is in a range of 50 μm to 280 μm, such as 50 μm, 80 μm, 100 μm, 130 μm, 150 μm, 180 μm, 200 μm, 230 μm, 250 μm, 280 μm and so on. The thickness H of the encapsulation layer may be in a range of 300 μm to 400 μm, such as 300 μm, 330 μm, 350 μm, 380 μm, 400 μm and so on.

In the embodiments of the present disclosure, the refractive index n1 of the plurality of bonding units 113 to the light and the refractive index n2 of the encapsulation layer 120 to the light are adjusted to satisfy a specific relationship, and a ratio Y of the height h of each of the plurality of bonding units 113 to the thickness H of the encapsulation layer 120 is controlled to satisfy specific values, such that the plurality of adhesive dots can not be detected on the surface of the photovoltaic module. In a practical operation, a following method can be used to determine whether the plurality of adhesive dots can be detected.

Gray values of different areas of the photovoltaic module are obtained by a camera to capture the surface of the photovoltaic module, so as to calculate a characteristic value G by following formula:

$$G = |g2 - g1|,$$

wherein the characteristic value G represents a threshold of the gray value, g1 represents a gray value of one part of the surface of the photovoltaic module 100 without the plurality of bonding units 113 (such as one part of the surface of the plurality of solar cells at 100 mm near the plurality of bonding units 113), and g2 represents a gray value of another part of the surface of the photovoltaic module with the plurality of bonding units. When the characteristic value G is greater than 20, the plurality of adhesive dots can be detected. When the characteristic value G is less than or equal to 20, the plurality of adhesive dots can not be detected. In the embodiments of the present disclosure, the photovoltaic module is detected by the above method, and the characteristic value G is less than or equal to 20.

In some embodiments, the plurality of conductive connectors 112 can be ribbons. A material of the ribbons is not limited, and can be copper wire. The copper wire can be plated lead brazing material on a surface of copper wire. The copper wire can be purchased from a market.

In some embodiments, the plurality of bonding units 113 can be at least of the plurality of adhesive dots, a plurality of adhesive sections, or a combination between the plurality of adhesive dot and the plurality of adhesive sections, which are formed by curing the adhesive. The adhesive can be cured by lamp radiation heating, UV irradiation or infrared heating. A type of each of the plurality of adhesives is not limited. A position of each of the plurality of adhesive dots corresponds to a position of each of the ribbons. The ribbons are attached to the plurality of solar cells 111 via the plurality of adhesive dots disposed at interval.

Referring to FIGS. 1, 2 and 4, the plurality of solar cells 111 are disposed at interval. One surface of one of the plurality of solar cells 111 is connected to another opposite surface of adjacent one of the plurality of solar cells 111, such that the plurality of solar cells 111 are connected to each other in serial. The plurality of bonding units 113 are disposed on the two surfaces of the battery string 110. An end of each of the plurality of conductive connectors 112 extends from one end of the plurality of solar cells 111 to another corresponding end of the plurality of solar cells 111 along a disposing direction of the plurality of solar cells 111. The plurality of conductive connectors 112 are disposed at interval along a direction perpendicular to the disposing direction of the plurality of solar cells.

For some types of the plurality of solar cells, such as a back contact (BC) battery, the plurality of conductive connectors are only disposed one surface of the battery string 110. Correspondingly, the plurality of bonding units 113 are disposed on only one surface of the battery string 110.

In some embodiments, referring to FIG. 1, a front surface of each of the plurality of solar cells 111 and a back surface of each of the plurality of solar cells 111 are both provided with the plurality of conductive connectors 112 and the plurality of bonding units 113. The encapsulation layer 120 includes a front adhesive film 121 and a back adhesive film 122. The front adhesive film 121 is attached to a front surface of the battery string 110, and the back adhesive film 122 is attached to a back surface of the battery string 110. When the plurality of conductive connectors 112 and the plurality of bonding units 113 are disposed on both the front surface of each of the plurality of solar cells 111 and the back surface of each of the plurality of solar cells 111, the front surface of the battery string 110 is encapsulated by the front adhesive film 121, and the back surface of the battery string 110 is encapsulated by the back adhesive film 122.

When the plurality of conductive connectors 112 and the plurality of bonding units 113 are disposed on both the front surface of each of the plurality of solar cells 111 and the back surface of each of the plurality of solar cells 111, and while the encapsulation layer 120 includes the front adhesive film 121 and the back adhesive film 122, the photovoltaic module meets at least one of following conditions that the characteristic value R is in a range of 0.014 to 0.118, such that the plurality of adhesive dots located on the front of the photovoltaic module are hidden in the adhesive film.

In some embodiments, the photovoltaic module 100 further includes a front protecting substrate 131 and a back protecting substrate 132. The front protecting substrate 131 is attached to an end surface of the front adhesive film 121 away from the battery string 110, and the back protecting substrate 132 is attached to an end surface of the back adhesive film 122 away from the battery string 110. The front protecting substrate 131 and the back protecting substrate 132 can be a transparent substrate to protect the front surface of the photovoltaic module and the back surface of the photovoltaic module.

The front protecting substrate 131 can be made of glasses, so as to improve a transmittance of light.

The back protecting substrate 132 can be made of at least one of glasses or polymer materials. When the back protecting substrate 132 is made of polymer materials, the back protecting substrate is made of at least one of glass and polymer material. The polymer material includes polyethylene terephthalate, polyolefin copolymer, polyamide, polyvinyl fluoride, polyvinylidene difluoride and any combination thereof.

In some embodiments, the photovoltaic module 100 further includes a frame 150 and a busbar 140. The frame 150 plays a protecting role for surrounding of the photovoltaic module 100, two adjacent battery strings 110 are connected to each other via the busbar 140 to form a circular unit.

Figure 8:
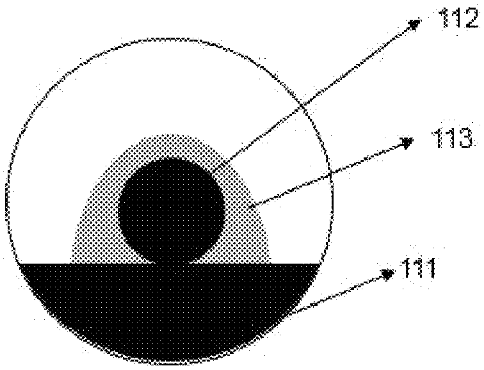
FIG. 8 is a partial schematic diagram of a plurality of adhesive dots fully wrapping ribbons.
Figure 9:
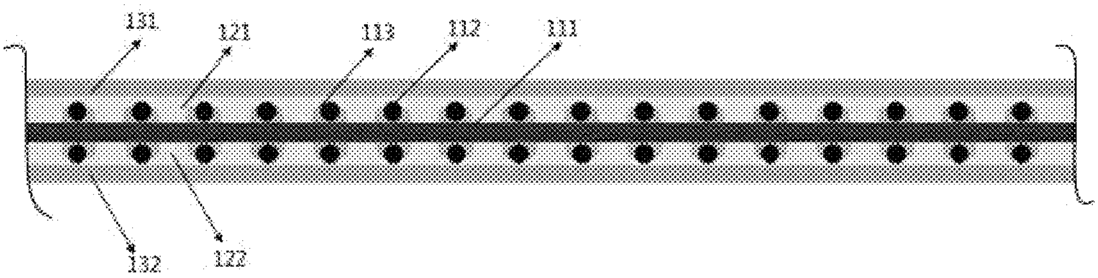
FIG. 9 is a cross-sectional schematic diagram of a plurality of adhesive dots partially wrapping ribbons.
Figure 10:
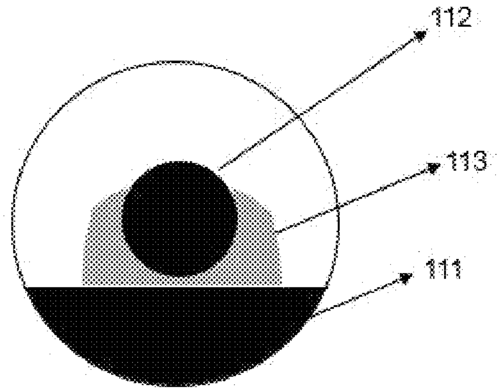
FIG. 10 is a partial schematic diagram of a plurality of adhesive dots partially wrapping ribbons.

In order to match and optimize different preparation processes of the photovoltaic module and different application scenarios of the photovoltaic module, the ribbons can be fully wrapped by the plurality of adhesive dots (shown in FIGS. 1 and 8) or partially wrapped by the plurality of adhesive dots (shown in FIGS. 9 and 10).

Referring to FIGS. 1 and 8, on a position where the plurality of bonding units 113 are located, surfaces of the plurality of conductive connectors 112 are wrapped by the plurality of bonding units 113, and the surfaces of the plurality of conductive connectors 112 are fully wrapped by the plurality of bonding units 113. When the battery string 110 is prepared by applying an adhesive to fix and then welding, the surfaces of the plurality of conductive connectors 112 are fully wrapped by the plurality of adhesive dots, which is shown in FIG. 8.

In other embodiments, referring to FIGS. 9 and 10, on a position where the plurality of bonding units 113 is located, each of the plurality of bonding units 113 is disposed between each of the plurality of conductive connectors 112 and each the plurality of solar cells 111 correspondingly. One part of the surface of the plurality of conductive connectors 112 is wrapped by the plurality of bonding units 113, and another part of the surface of the plurality of conductive connectors 112 away from the plurality of solar cells 111 is not wrapped by the plurality of bonding units 113. When the plurality of conductive connectors 112 is fixed by applying the adhesive to fix and then welding or only fixed by applying the adhesive, the plurality of conductive connectors 112 are partially wrapped by the plurality of adhesive dots as shown in FIG. 10.

The present disclosure provides a preparing method for a photovoltaic module. The method includes disposing a plurality of conductive connectors 112 on at least one surface of each of a plurality of solar cells 111 along a thickness direction of each of the plurality of solar cells 111, bonding the plurality of conductive connectors 112 with the plurality of solar cells 111 via a plurality of bonding units 113 to form a battery string 110; and encapsulating the battery string 110 via an encapsulation layer 120 of the photovoltaic module.

During a preparing process of the photovoltaic module, the refractive index of the encapsulation layer 120 to the light, the refractive index of the adhesive to the light and the thickness of the encapsulation layer 120 are matched, the characteristic value R is defined as an intensity of the refractive light when the light enters the plurality of bonding units 113 from the encapsulation layer 120, the characteristic value R satisfies following formula (1):

$$R = \frac{|n2 - n1|}{\frac{1}{2}(n1 + n2)}.$$

The characteristic value Y is configured to show a matching relationship between the thickness of the encapsulation layer 120 and the height of each of the plurality of bonding units 113, and the characteristic value Y satisfies following formula (2):

$$Y = \frac{h}{H},$$

n1 represents a refractive index of the plurality of bonding units to light, n2 represents a refractive index of the encapsulation layer to light, the characteristic value R is in a range of 0.014 to 0.118 by adjusting the refractive index n1 of the plurality of bonding units to the light and the refractive index n2 of the encapsulation layer to the light;

the characteristic value Y is less than or equal to 0.9;

H represents a thickness of the encapsulation layer 120. The thickness H of the encapsulation layer 120 is defined as a distance between a first position of the encapsulation layer and a second position of the encapsulation layer along a direction perpendicular to the battery string. The first position of the encapsulation is located on a surface of each of the plurality of solar cells and mostly towards the surface of each of the plurality of solar cells along a direction perpendicular to the battery string. The second position of the encapsulation is located on the surface of each of the plurality of solar cells and mostly away from the surface of each of the plurality of solar cells;

h represents a height of each of the plurality of bonding units 113. The height h of each of the plurality of bonding units 113 is defined as a distance between a first position of each of the plurality of bonding units 113, in which the first position of each of the plurality of bonding units 113 is located on a surface of each of the plurality of solar cells 111 and mostly towards the surface of each of the plurality of solar cells 111, and a second position of each of the plurality of bonding units 113, in which the second position of each of the plurality of bonding units 113 is located on the surface of each of the plurality of solar cells 111 and mostly away from the surface of each of the plurality of solar cells 111 along the direction perpendicular to the plurality of solar cells 111.

During a preparing process, the refractive index n1 of the encapsulation layer 120 to the light and the refractive index n2 of the plurality of bonding units 113 to the light are adjusted, and the encapsulation layer 120 can better match with the plurality of bonding units 113, such that the contour of the plurality of adhesive dots can not be seen from the surface of the photovoltaic module, facilitating improving the power of the photovoltaic module.

In some embodiments, the plurality of solar cells 111 are disposed along a first direction. A fine grid line of each of the plurality of solar cells 111 is disposed along a second direction. The first direction intersects with the second direction. The plurality of conductive connectors 112 are disposed along the first direction when the plurality of conducive connectors 112 are mounted. The preparing process of the battery string 110 can use welding and dispensing technology. The battery string 110 can be prepared by dispensing adhesive to fix and then welding or by welding and then dispensing adhesive to fix.

In the embodiments of the present disclosure, a photovoltaic power generation apparatus is provided. The photovoltaic power generation device includes a photovoltaic module 100 in the embodiments of the present disclosure. The number of the photovoltaic module 100 can be M, M photovoltaic modules are connected to each other in series, and Mis an integer not less than 1. The number of the photovoltaic modules can be adjusted as required.

In some embodiments, the photovoltaic power generation apparatus can include an inverter. An output end of the photovoltaic power generation apparatus is connected to an input end of the inverter, which is configured for photovoltaic power generation.

The characteristic and performance of the present disclosure is further described in detail, which is combined with following examples.

First Example

A preparing method for a photovoltaic module in the present example is provided. The method includes following steps.

(1) A Preparation of Materials

An adhesive is prepared. In detail, an organic silicone adhesive was purchased from a market (purchased from Delangju New Materials Co., Ltd., model SE-6002). The organic silicone adhesive was cured, and the refractive index of the adhesive to light was 1.42 at a temperature of the range of 24 degrees centigrade to 26 degrees centigrade.

An encapsulation adhesive film (including a front encapsulation adhesive film and a back encapsulation adhesive film) is prepared. In detail, a front encapsulation adhesive film was regarded as an EPE (expandable polyethylene) encapsulation adhesive film purchased from a market (purchased from Hangzhou Foster Applied Materials Co., Ltd., model EP304), and a back encapsulation adhesive film was regarded as an EVA (Ethylene Vinyl Acetate Copolymer) encapsulation adhesive film purchased from a market (purchased from Hangzhou Foster Applied Materials Co., Ltd., model F406P). After the front encapsulation adhesive film and the back encapsulation adhesive being laminated, the refractive index n2 of the front encapsulation adhesive film to the light and the refractive index n2 of the back encapsulation adhesive film to the light were both 1.48 at a temperature of the range of 24° C. to 26° C.

A ribbon is prepared. In detail, a copper wire with tin plated lead brazing material was purchased from the market, in which a thickness of brazing material layer of the copper wire was 15 μm and a diameter of the copper wire was 0.22 mm.

A solar cell was selected as a solar cell without main gate crystalline silicon solar energy (produced by Tongwei Solar Energy (Meishan) Co., Ltd., model SY11), in which a size of the solar cell was 210 mm*210 mm, and a thickness of the solar cell was 130 μm and a diameter of a half of the solar cell is 210 mm*105 mm.

A flux was purchased from Shaoxing Tuobang New Energy Co., Ltd., and a model of the flux was FC10V16-6.

A busbar was a flat reflective busbar purchased from the market and made of tin plated copper tape.

A front glass (i.e., front protective substrate 131) was double coated glass purchased from the market.

A back glass (i.e., back protective substrate 132) was non glazed transparent three-holes glass purchased from the market, in which a diameter of the back glass was 12 mm.

(2) a Preparation of a Battery String

Front surfaces and back surfaces of eleven and a half of the solar cells were printed with an appropriate amount of an adhesive in sequence. A distance between adjacent printing-adhesive positions was 10 mm. The ribbon was soaked in a flu solution at 1 s, and then the ribbon was disposed on a surface of the adhesive, respectively. A disposing direction of the ribbon was parallel to a shorter side of the half of the solar cell. A positive electrode of one solar cell is connected to a negative electrode of another adjacent solar cell in sequence via the ribbon. The ribbon was alloyed with eleven and a half of the solar cells under a light box of a welding machine, while the adhesive was cured.

(3) Encapsulation

The front glass, the front encapsulation adhesive film, the battery string, the back adhesive film, the back glass was stacked up in sequence. Adjacent battery strings were connected via the busbars, and then the front encapsulation adhesive film and the back encapsulation adhesive film were melted and cross-linked by laminating to obtain an encapsulation battery string. The encapsulation battery string is cut and installed with a frame to obtain a photovoltaic module.

A partial schematic diagram of the photovoltaic module prepared in the first example was shown in FIG. 4. A contour of a plurality of adhesive dots on the photovoltaic module could not be seen under visual inspection.

Second Example to Sixth Example and Eleventh Example

The second example to the sixth example and eleventh example were substantially the same as that of the first example, excepting that refractive index n1 of an adhesive to light and refractive index n2 to light were different, which was shown in table 1.

Seventh Example to Tenth Example

The seventh example to the tenth example were substantially the same as that of the third example, excepting that a thickness H of an adhesive film after being laminated and a height of an adhesive after being cured were different, which was shown in table 1.

First Comparative Example to Sixth Comparative Example

The first comparative example to the sixth comparative example were substantially the same as that of the first example, excepting that refractive index n1 of an adhesive to light, a refractive index n2, a thickness H of an adhesive film after laminated, a thickness h of an adhesive after cured were different, which was shown in table 1.

Figure 11:
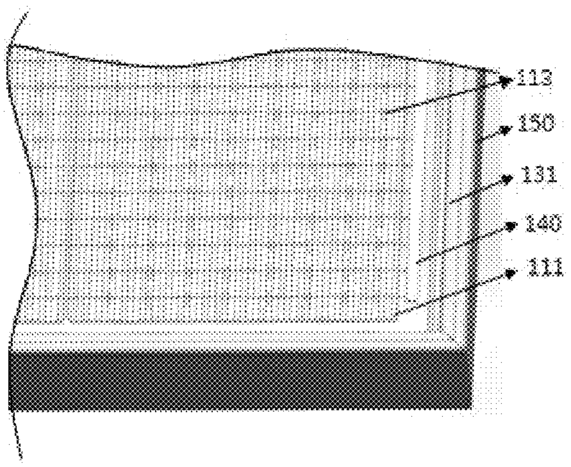
FIG. 11 is a cross-sectional schematic diagram of a photovoltaic module in comparative example 1.

A partial schematic diagram of the photovoltaic module prepared by the first comparative example to the six comparative example was shown in FIG. 11, in which the plurality of adhesive dots could be clearly seen.

First Test Example

The photovoltaic modules obtained by the first example to the tenth example and the first comparative example to the sixth comparative example, and the result of the test was shown in table 1.

A test method includes following tests.

(1) an adhesive-dot test included a detecting method for a contour of the plurality of adhesive dots after the photovoltaic module being laminated. A surface of the photovoltaic module was shoot by a camera, gray value of different areas of a surface of the photovoltaic module were obtained by a set algorithm program or software such as R3 and Lumi Tools. The gray value of the different areas of the surface of the photovoltaic module satisfy following formula: $G=|g2-g1|$.

A characteristic value G represents a threshold of the gray value, g1 represents a gray value of one part of the surface of the photovoltaic module without the plurality of adhesive dots, and g2 represents a gray value of another part of the surface of the photovoltaic module with the plurality of adhesive dots. When the characteristic value G was greater than 20, the plurality of adhesive dots could be detected. When the characteristic value G was less than or equal to 20, the plurality of adhesive dot could not be detected.

(2) A test for a refractive index included that the adhesive purchased from the market and the adhesive film purchased from the market were cured and laminated at a process temperature, respectively, and then cooled to a room temperature (in a range of 24° C. to 26° C.) to obtain a sample to be detected. A refractive index of the sample to be tested was tested by a refractive index test instrument (such as abbe refractometer) at an environment in the range of 24 degrees centigrade to 26 degrees centigrade.

(3) A test for a performance of the photovoltaic module included that power if the photovoltaic module was tested by using a standard of IEC 61215.

TABLE 1 a test result of a performance of a photovoltaic module obtained by examples and comparative examples

| Number of examples | Refractive index n1 of adhesive being cured | Refractive index n1 of adhesive film being laminated | Charac-teristic value R | Thickness H of adhesive film being laminated/ μm | Height of adhesive being cured/ μm | Charac-teristic value Y | Result of visual inspection | Charac-teristic value G | Result of adhesive dot | Power |
|---|---|---|---|---|---|---|---|---|---|---|
| First example | 1.46 | 1.48 | 0.014 | 360 | 150 | 0.42 | The adhesive dot could not be seen | ≤20 | The adhesive dot could not be detected | 615.2 W |
| Second example | 1.45 | 1.48 | 0.020 | 360 | 150 | 0.42 | The adhesive dot could not be seen | ≤20 | The adhesive dot could not be detected | 615.4 W |
| Third example | 1.42 | 1.48 | 0.041 | 360 | 150 | 0.42 | The adhesive dot could not be seen | ≤20 | The adhesive dot could not be detected | 615.7 W |
| Fourth example | 1.37 | 1.51 | 0.097 | 360 | 150 | 0.42 | The adhesive dot could not be seen | ≤20 | The adhesive dot could not be detected | 615.3 W |
| Fifth example | 1.40 | 1.55 | 0.102 | 360 | 150 | 0.42 | The adhesive dot could not be seen | ≤20 | The adhesive dot could not be detected | 615.1 W |
| Sixth example | 1.36 | 1.53 | 0.118 | 360 | 150 | 0.42 | The adhesive dot could not be seen | ≤20 | The adhesive dot could not be detected | 615.0 W |
| Seventh example | 1.42 | 1.48 | 0.041 | 300 | 270 | 0.9 | The adhesive dot could not be seen | ≤20 | The adhesive dot could not be detected | 615.5 W |
| Eighth example | 1.42 | 1.48 | 0.041 | 350 | 200 | 0.57 | The adhesive dot could not be seen | ≤20 | The adhesive dot could not be detected | 615.5 |
| Ninth example | 1.42 | 1.48 | 0.041 | 400 | 50 | 0.13 | The adhesive dot could not be seen | ≤20 | The adhesive dot could not be detected | 615.4 W |
| Tenth example | 1.42 | 1.48 | 0.041 | 400 | 280 | 0.7 | The adhesive dot could not be seen | ≤20 | The adhesive dot could not be detected | 615.5 W |
| Eleventh example | 1.48 | 1.42 | 0.041 | 360 | 150 | 0.42 | The adhesive dot could not be seen | ≤20 | The adhesive dot could not be detected | 615.0 W |
| First Comparative example | 1.47 | 1.48 | 0.007 | 360 | 150 | 0.42 | The adhesive dot could not be seen | ≤20 | The adhesive dot could not be detected | 614.8 W |
| Second comparative example | 1.38 | 1.57 | 0.129 | 360 | 150 | 0.42 | A part of the adhesive dot could be seen | >20 | The adhesive dot could be detected | 614.8 W |
| Third comparative example | 1.35 | 1.65 | 0.200 | 360 | 150 | 0.42 | The adhesive dot could be seen | >20 | The adhesive dot could be detected | 614.7 W |
| Fourth comparative example | 1.42 | 1.48 | 0.041 | 300 | 280 | 0.93 | A part of the adhesive dot could be seen | >20 | The adhesive dot could not be detected | 614.7 W |

It could be seen that when the characteristic value R and the characteristic value Y were out of a range limited by the present disclosure (i.e., the characteristic value R is not in a range of 0.014 to 0.118, the characteristic value Y is not less than or equal to 0.9), the power of the photovoltaic module was reduced correspondingly, the adhesive dot could not be detected on the surface of the photovoltaic module, which was not conducive to improving the aesthetics of the photovoltaic module.

Comparing the first example to the sixth example, when the characteristic R increased, the power increased and then decreased. In the second example to the fourth example, the characteristic value R was in a range of 0.02 to 0.097.

Comparing the third example and the seventh example to the tenth example, when the thickness H, the height h and the characteristic value Y were all in the range (i.e., the characteristic value Y is not less than or equal to 0.9), the characteristic value Y substantially affected the power of the photovoltaic value, and the plurality of adhesive dots could not be seen under the visual inspection. Comparing the example 3 and the example 11, the characteristic value R was the same as the characteristic value Y, but in the eleventh example, the refractive index n1 was greater than the refractive index n2, an optical transmission path would approach the solder strip (shown in FIG. 6), resulting in shading and reducing the power of the photovoltaic module. In the twelfth example, the characteristic value Y was in the range, but the height h of each of the plurality of adhesive dots was too high, air enters the adhesive during an adhesive printing process, such that the plurality of adhesive dots being laminated had a bubble inside. Intensity of a reflection light of an interface between the bubble and the plurality of adhesive dots was relative greater, resulting in that the plurality of adhesive dots could be seen under the visual inspection.

In the first comparative example, the refractive index n1 was close to the refractive index n2, so the characteristic value R was too less, such that the light was covered by the ribbon. In the second comparative example, difference between the refractive index n1 and the refractive index n2 is too great, so the characteristic value is relative great. In the first comparative example and the second comparative example, the power of the photovoltaic modules was relatively less. In addition, in the second comparative example, since the characteristic value R was too greater, the plurality of adhesive dots could be seen. In the third comparative example, the characteristic value R was relative greater, so the plurality of adhesive dots could be seen. In the fourth example, the characteristic value Y was relative greater, the height h of each of the plurality of adhesive dots was relative greater, and the thickness of the adhesive film was too less, leading to insufficient filling of the adhesive film, such that the bubble was appeared on the surface of the plurality of adhesive dots, resulting in improving the reflection intensity of the light on the surface of the plurality of adhesive dots, therefore, the plurality of adhesive dot could be seen.

The above are only some embodiments of the present disclosure and are not intended to limit the present disclosure. For those skilled in the art, the present invention may have various modifications and variations. Any modifications, equivalent substitutions, improvements and so on made within a spirit and principles of the present disclosure shall be included within a scope of protection of the present disclosure.

What is claimed is:

1. A photovoltaic module, comprising:

a battery string, wherein the battery string comprises a plurality of solar cells and a plurality of conductive connectors, adjacent two of the plurality of solar cells are electrically connected to each other via the plurality of conductive connectors; and an encapsulation layer, wherein the encapsulation layer is attached to the battery string;

wherein a plurality of bonding units are provided between the encapsulation layer and the battery string, the plurality of bonding units are configured to bond the plurality of conductive connectors on the plurality of solar cells;

a characteristic value R satisfies following formula (1):

$$R = \frac{|n2 - n1|}{\frac{1}{2}(n1 + n2)};$$

a characteristic value Y satisfies following formula (2):

$$Y = \frac{h}{H},$$

wherein the characteristic value R is in a range of 0.014 to 0.118;

n1 represents a refractive index of the plurality of bonding units to light;

n2 represents a refractive index of the encapsulation layer to light;

the characteristic value Y is less than or equal to 0.9;

H represents a thickness of the encapsulation layer;

h represents a height of each of the plurality of bonding units; and the height of each of the plurality of bonding units is in a range of 50 μm to 280 μm.

2. The photovoltaic module of claim 1, wherein the characteristic value R is in a range of 0.020 to 0.097.

3. The photovoltaic module of claim 1, wherein the refractive index n1 of the plurality of bonding units to the light is less than the refractive index n2 of the encapsulation layer to the light.

4. The photovoltaic module of claim 3, wherein the refractive index n2 of the encapsulation layer to the light is in a range of 1.40 to 1.65, and the thickness of the encapsulation layer is in a range of 300 μm to 400 μm;

and/or, the encapsulation layer is formed by laminating and cross-linking an encapsulation adhesive film, and the encapsulation adhesive film is selected from the group consisting of an encapsulation adhesive film of polyolefin elastomer, an encapsulation adhesive film of ethylene vinyl acetate copolymer, an encapsulation adhesive film of a co-extrusion product with polyolefin elastomer and ethylene vinyl acetate copolymer, and any combination thereof.

5. The photovoltaic module of claim 1, wherein the plurality of bonding units are disposed on at least one surface of the battery string;

and/or the plurality of bonding units are formed by curing an adhesive.

6. The photovoltaic module of claim 5, wherein the refractive index n1 of the plurality of bonding units to the light is in a range of 1.35 to 1.60;

and/or, the adhesive configured to form the plurality of bonding units is selected from the group consisting of an organic silicone adhesive, an acrylic adhesive, an epoxy resin adhesive and any combination thereof.

7. The photovoltaic module of claim 1, wherein gray values of different areas of the photovoltaic are obtained by a camera to capture a surface of the photovoltaic module, so as to calculate a characteristic value G;

the characteristic value G satisfies following formula:

$$G = |g2 - g1|;$$

wherein the characteristic value G represents a threshold of the gray value, g1 represents a gray value of one part of the surface of the photovoltaic module without the plurality of bonding units, and g2 represents a gray value of another part of the surface of the photovoltaic module with the plurality of bonding units; and the characteristic value G is less than or equal to 20.

8. The photovoltaic module of claim 1, wherein a surface of each of the plurality of conductive connectors on a position where the plurality of bonding units are located is wrapped by each of the plurality of bonding units.

9. The photovoltaic module of claim 1, wherein on a position where the plurality of bonding units are located, each of the plurality of bonding units is disposed between each of the plurality of conductive connectors and each of the plurality of solar cells correspondingly, and a part of a surface of each of the plurality of conductive connectors is covered by each of the plurality of bonding units.

10. The photovoltaic module of claim 1, wherein a front surface of each of the plurality of solar cells and a back surface of each of the plurality of solar cells are both provided with the plurality of conductive connectors and the plurality of bonding units, the encapsulation layer comprises a front adhesive film and a back adhesive film, the front adhesive film is attached to a front surface of the battery string, and the back adhesive film is attached to a back surface of the battery string;

the photovoltaic module meets at least one of following conditions:

the characteristic value R is in a range of 0.014 to 0.118; a ratio Y of a height of each of the plurality of bonding units to a thickness of the front adhesive film is less than or equal to 0.9;

and/or, the plurality of conductive connectors are ribbons.

11. The photovoltaic module of claim 10, wherein the plurality of solar cells are disposed at interval, and one surface of one of the plurality of solar cells is connected to another opposite surface of adjacent one of the plurality of solar cells.

12. The photovoltaic module of claim 10, further comprising a front protecting substrate and a back protecting substrate, wherein the front protecting substrate is attached to an end surface of the front adhesive film away from the battery string, and the back protecting substrate is attached to an end surface of the back adhesive film away from the battery string.

13. The photovoltaic module of claim 12, wherein the front protecting substrate is made of glass;

and/or the back protecting substrate is made of at least one of the glass and high molecular polymer, wherein the high molecular polymer comprises polyethylene terephthalate, polyolefin copolymer, polyamide, polyvinyl fluoride, and polyvinylidene difluoride.

14. A photovoltaic power generation apparatus, comprising the photovoltaic module of claim 1;

wherein the number of the photovoltaic module is M, M photovoltaic module are connected in series, and M is an integer not less than 1.

15. A preparing method for a photovoltaic module, comprising: disposing a plurality of conductive connectors on at least a surface of a plurality of solar cells along a thickness direction of each of the plurality of solar cells, bonding the plurality of conductive connectors with the plurality of solar cells via a plurality of bonding units to form a battery string; and encapsulating the battery string via an encapsulation layer of the photovoltaic module, wherein a characteristic value R satisfies following formula (1):

$$R = \frac{|n2 - n1|}{\frac{1}{2}(n1 + n2)};$$

a characteristic value Y satisfies following formula (2):

$$Y = \frac{h}{H};$$

wherein n1 represents a refractive index of the plurality of bonding units to light;

n2 represents a refractive index of the encapsulation layer to light;

the characteristic value R is in a range of 0.014 to 0.118 by adjusting the refractive index n1 of the plurality of bonding units to the light and the refractive index n2 of the encapsulation layer to the light;

H represents a thickness of the encapsulation layer;

h represents a height of each of the plurality of bonding units; and the characteristic value Y is less than or equal to 0.9 by adjusting the thickness H of the encapsulation layer.

16. The method of claim 15, wherein disposing the plurality of conductive connectors on the at least one surface of the plurality of solar cells along the thickness direction of each of the plurality of solar cells, bonding the plurality of conductive connectors with the plurality of solar cells via the plurality of bonding units to form the battery string further comprises:

disposing the plurality of solar cells along a first direction, disposing a fine grid line of each of the plurality of solar cells along a second direction, wherein the first direction intersects with the second direction;

disposing the plurality of conductive connectors along the first direction when the plurality of conducive connectors are mounted; and preparing the battery string by applying an adhesive to fix and then welding, or preparing the battery string by welding and then applying an adhesive to fix.

17. The method of claim 15, wherein the characteristic value R is in a range of 0.02 to 0.097.

18. The method of claim 15, wherein the refractive index n1 of the plurality of bonding units to the light is less than the refractive index n2 of the encapsulation layer to the light.

19. A photovoltaic power generation apparatus, comprising the photovoltaic module obtained by the method of claim 15;

wherein the number of the photovoltaic module is M, M photovoltaic module are connected in series, and M is an integer not less than 1.

* * * * *